US009203009B2

(12) United States Patent
Choi

(10) Patent No.: US 9,203,009 B2
(45) Date of Patent: Dec. 1, 2015

(54) ELECTRODE MODULE FOR LED LAMP

(71) Applicant: TRUE STAR, INC., Daejeon (KR)

(72) Inventor: Wone-Hee Choi, Daejeon (KR)

(73) Assignee: TRUE STAR, INC., Daejeon (KR)

( * ) Notice: Subject to any disclaimer, the term of this patent is extended or adjusted under 35 U.S.C. 154(b) by 0 days.

(21) Appl. No.: 14/391,730

(22) PCT Filed: Jan. 9, 2014

(86) PCT No.: PCT/KR2014/000247
§ 371 (c)(1),
(2) Date: Oct. 10, 2014

(87) PCT Pub. No.: WO2014/115986
PCT Pub. Date: Jul. 31, 2014

(65) Prior Publication Data
US 2015/0076986 A1    Mar. 19, 2015

(30) Foreign Application Priority Data

Jan. 24, 2013  (KR) ........................ 10-2013-0008194

(51) Int. Cl.
*H01J 1/02*        (2006.01)
*H01J 7/24*        (2006.01)
*H01J 61/52*       (2006.01)
(Continued)

(52) U.S. Cl.
CPC .............. *H01L 33/644* (2013.01); *H01L 24/97* (2013.01); *H01L 33/387* (2013.01); *F21K 9/00* (2013.01);
(Continued)

(58) Field of Classification Search
CPC . H01L 25/167; H01L 25/0753; H01L 25/075; H01L 33/62; H01L 33/387; H01L 33/644; H01L 24/97; F21S 2/005; F21S 4/006

USPC .......... 362/249.02, 249.06, 800, 249.01, 218, 362/294, 249.14, 545; 313/46, 498, 500, 313/506; 257/98–100
See application file for complete search history.

(56) References Cited

U.S. PATENT DOCUMENTS 6,386,733 B1 * 5/2002 Ohkohdo et al. ........ 362/249.06
8,157,415 B2 * 4/2012 Tseng et al. ............. 362/249.02
(Continued)

FOREIGN PATENT DOCUMENTS

| JP | 2010-177048 A | 8/2010 |
| KR | 10-2005-0071369 A | 7/2005 |
| KR | 10-2011-0022545 A | 3/2011 |

OTHER PUBLICATIONS

International Search Report for PCT/KR2014/000247 mailed Apr. 4, 2014 from Korean Intellectual Property Office.

*Primary Examiner* — Thomas A Hollweg
*Assistant Examiner* — Kevin Quarterman
(74) *Attorney, Agent, or Firm* — Paratus Law Group, PLLC

(57) ABSTRACT

There is provided an electrode module for an LED lamp. The electrode module is provided by cutting an original electrode plate in a predetermined shape, the original electrode plate including a nonconductive frame having a mounting hole for accommodating an LED device, and a conductive electrode pattern integrally coupled with the frame and supplying power to the LED device. The electrode pattern has unit bodies formed repeatedly, and each unit body includes first and second parallel lines arranged on both sides, a body portion interposed between the first and second parallel lines, and upper and lower lines arranged at the upper and lower portions of the body portion and connected with the body portion through a vertical disconnectable portion. Both sides of the upper and lower lines connected to the body portions, which are adjacent to each other, are connected with each other through first and second serial lines.

14 Claims, 13 Drawing Sheets

(51) Int. Cl.
*H01K 1/58* (2006.01)
*H01L 33/64* (2010.01)
*H01L 33/38* (2010.01)
*H01L 23/00* (2006.01)
*F21Y 101/02* (2006.01)
*F21K 99/00* (2010.01)

(52) U.S. Cl.
CPC ... *F21Y 2101/02* (2013.01); *H01L 2224/48091* (2013.01); *H01L 2224/48247* (2013.01); *H01L 2224/48257* (2013.01); *H01L 2224/73265* (2013.01)

(56) References Cited

U.S. PATENT DOCUMENTS

| | | | |
|---|---|---|---|
| 8,579,468 B2 * | 11/2013 | Wagatsuma et al. | 362/249.02 |
| 8,637,882 B2 * | 1/2014 | Stoyan | 257/98 |
| 8,638,037 B2 * | 1/2014 | Moon et al. | 315/185 R |
| 2001/0024368 A1 * | 9/2001 | Henrici et al. | 362/249 |
| 2005/0239342 A1 | 10/2005 | Moriyama et al. | |
| 2010/0188846 A1 | 7/2010 | Oda et al. | |
| 2010/0254119 A1 | 10/2010 | Naijo | |
| 2011/0050111 A1 | 3/2011 | Tanaka et al. | |

* cited by examiner

ELECTRODE MODULE FOR LED LAMP

CROSS REFERENCE TO PRIOR APPLICATIONS

This application is a National Stage Patent Application of PCT International Patent Application No. PCT/KR2014/000247 (filed on Jan. 9, 2014) under 35 U.S.C. §371, which claims priority to Korean Patent Application No. 10-2013-0008194 (filed on Jan. 24, 2013), which are all hereby incorporated by reference in their entirety.

TECHNICAL FIELD

The present invention relates, in general, to an electrode module for an LED lamp and, more particularly, to an electrode module for an LED lamp, which is capable of using electrode patterns of various structures by cutting an original electrode plate which has unit bodies formed repeatedly thereon in accordance with a use thereof.

BACKGROUND ART

Generally, an LED is a kind of diode. When a voltage is forwardly applied to the LED, electrons are transferred by electromagnetic induction. At this time, the electrons generate light energy and thermal energy, which are in inverse proportion to each other. Thus, the rapid removal of heat generated from the LED can increase the generation of photons. When a light source of the LED maintains an active temperature of about 25 to 55° C., light output and light efficiency can be maximized. Further, it is possible to maintain the durability of the LED. That is, a quantity of heat exceeding a quantity that is required to appropriately activate the electrons reduces the generation of the photons, and an excessive quantity of current resulting from the heat lowers a binding force between atomic structures, with the result that the LED may be undesirably destroyed. The problem relating to such heat generation occurs when the LED light source of high luminance and high electric power to be used as an illumination is manufactured. It is necessary to design the LED so as to rapidly discharge a quantity of heat, which is generated from the LED and exceeds a quantity for activating the electrons. Most LED manufacturing companies are developing a package design which may solve the above-mentioned problems, and an LED light source of a high wattage manufactured in this manner is commonly referred to as a power LED. Generally, the LED light source is made by mounting an LED chip or package on a PCB. The conventional LED light source emits light through the following process: current is input through a thin copper circuit layer of the PCB into a positive electrode of the LED chip and then is output through the LED chip to a negative electrode. However, the thin copper circuit layer of the PCB is limited to promote electrical connection, so that heat generated simultaneously with current resistance occurring in the LED chip and the circuit and the photons generated from the chip is dissipated by an indirect heat dissipating method where the heat is transferred to a heat dissipating plate through an insulation layer provided on a lower portion of the PCB. Thus, heat dissipating efficiency is lower in comparison with the quantity of generated heat and there is a restriction on implementing the LED light source of high illuminating power.

DISCLOSURE

Technical Problem

Accordingly, the present invention has been made keeping in mind the above problems occurring in the related art, and is intended to provide an electrode module for an LED lamp, in which a heat sink is manufactured by processing metal, having high electric conductivity and heat conductivity, and then the heat sink is utilized as an electrode for supplying power to an LED device, so that heat generated from the LED device is directly discharged through the heat sink, thus improving heat dissipating characteristics and simultaneously realizing the stabilization of a light source, with the result that it is possible to achieve both high illuminating power and high output.

Technical Solution

In an aspect, the present invention provides an electrode module for an LED module, including a frame made of a nonconductive material and having a mounting hole for accommodating an LED device; and an electrode pattern made of a conductive material, integrally coupled with the frame and supplying power to the LED device accommodated in the mounting hole, wherein the electrode pattern includes unit bodies formed repeatedly side by side, each of the unit bodies including: first and second parallel lines arranged side by side on both sides; a body portion interposed between the first and second parallel lines; and upper and lower lines arranged side by side at upper and lower portions of the body portion, connected with the body portion for each section through a vertical disconnectable portion, and connected at both sides thereof with the first and second parallel lines, respectively, via power feeding lines, wherein the both sides of the upper and lower lines connected to body portions, which are adjacent to each other, are connected with each other through first and second serial lines.

Advantageous Effects

As described above, the electrode module for the LED module according to the present invention maximizes the surface area of the electrode portion on which the LED device is mounted, thus minimizing thermal resistance and maximizing the flow of electrons in the lead wire, and maximally copes with surface resistance on the surface of the electrode in the LED, thus minimizing a voltage drop.

In addition, the electrode module of this invention can ensure the massive heat transfer passage and electricity flow passage which are minimized in terms of resistance due to the maximized electrode surface area, and allows the thermal equilibrium between the LED and the electrode to be rapidly reached as the surface area of the electrode is increased. Thus, it is possible to solve the problem where the temperature of the LED active layer abruptly rises, and the resistance of the LED is stabilized, thus resulting in stabilizing the current, and the driving by the constant current upon designing the converter can be easily implemented.

Further, the electrode module of this invention can increase the coupling rate of the electrons with the holes in the LED active layer, so that the efficiency of the LED is increased and a heat dissipating function is improved, thus enabling the temperature of the LED to be rapidly lowered.

Particularly, since the electrode pattern may be rolled up or curved, processability is good and it is possible to provide the electrode pattern of various outputs. In the serial or parallel circuit configuration, additional wiring or PCB is not required, and simultaneously it is possible to form the circuit of the module without a soldering process.

BEST MODE

Figure 1:
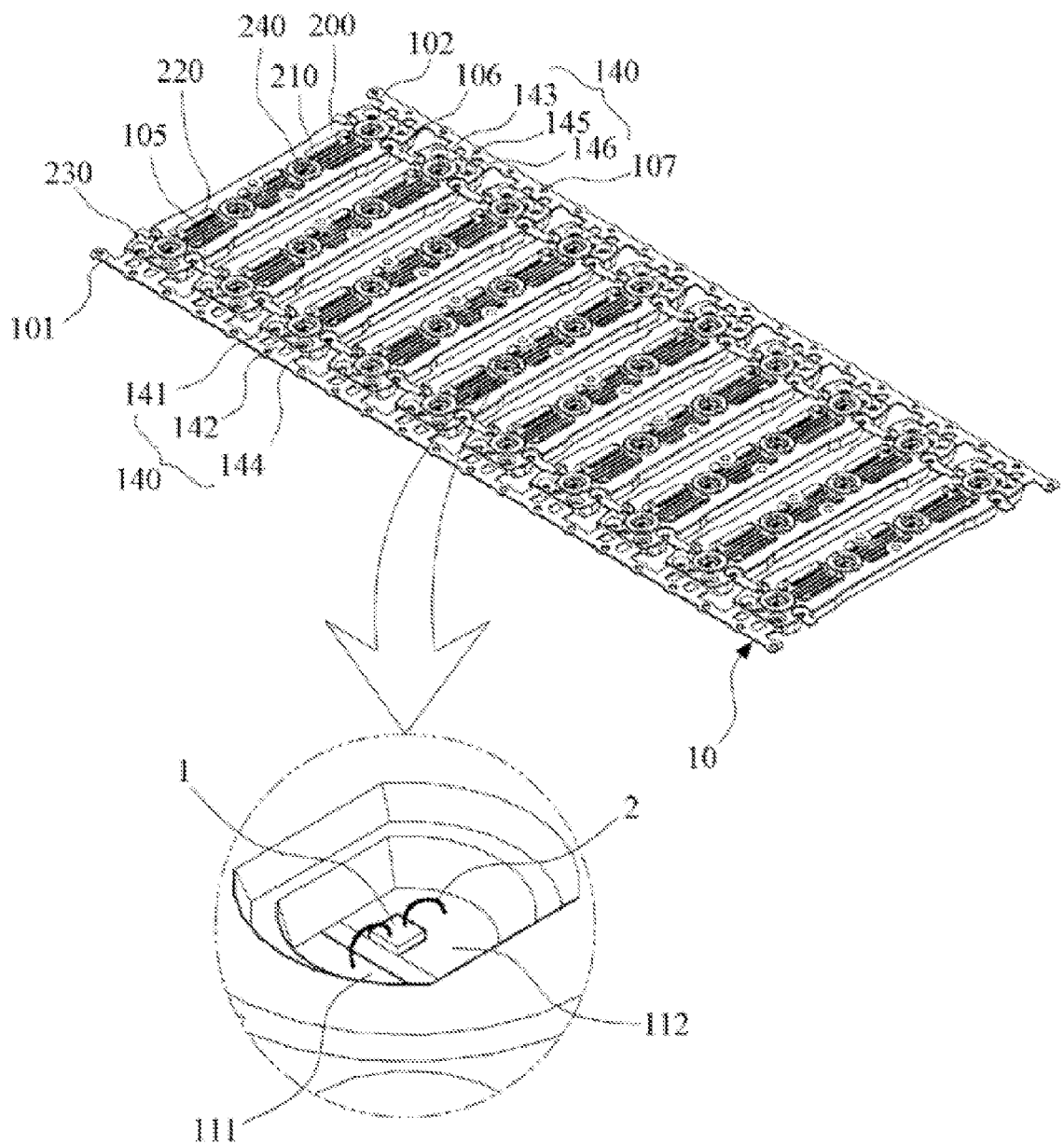
FIG. 1 is a perspective view showing a state where an original electrode plate is coupled with a frame according to an embodiment of the present invention.

Hereinafter, the present invention will be described in detail with reference to the accompanying drawings. Like reference numerals designate like elements throughout the specification. In the following description, if it is decided that the detailed description of known function or configuration related to the invention makes the subject matter of the invention unclear, the detailed description is omitted. Exemplary embodiments of the present invention will be provided to make the present invention be more completely understood by those skilled in the art. Thus, the shape and size of components may not be illustrated to scale in the drawings but may be exaggerated for clarity.

FIG. 1 is a perspective view showing a state where an original electrode plate is coupled with a frame according to an embodiment of the present invention. The electrode module for the LED lamp according to the present invention includes a frame 200 which is made of a nonconductive material and has a mounting hole 210 for accommodating an LED device 1, and an electrode pattern 100 which is made of a conductive material, is integrally coupled with the frame 200 and supplies power to the LED device 1 accommodated in the mounting hole 210.

According to the embodiment of the present invention, the electrode pattern 100 is formed by repeatedly arranging unit bodies 11 side by side. Each unit body includes first and second parallel lines 101 and 102 which are disposed on both sides thereof side by side, a body portion 110 which is disposed between the first and second parallel lines 101 and 102, and upper and lower lines 120 and 130 which are disposed on upper and lower portions of the body portion 110 side by side, are connected to the body portion 110 via a vertical disconnectable portion 103 for each section, and are connected at both sides thereof to the first and second parallel lines 101 and 102 by a power feeding line 140. The electrode pattern is configured by cutting an original electrode plate 10 into a predetermined shape. Here, the original electrode plate made of a conductive material is configured such that the upper line 120 and the lower line 130 connected to neighboring body portions 110 are connected at both sides thereof to each other via first and second serial lines 105 and 106. The original electrode plate 10 is made of the conductive material, which may be preferably subjected to bending processing.

Figure 2:
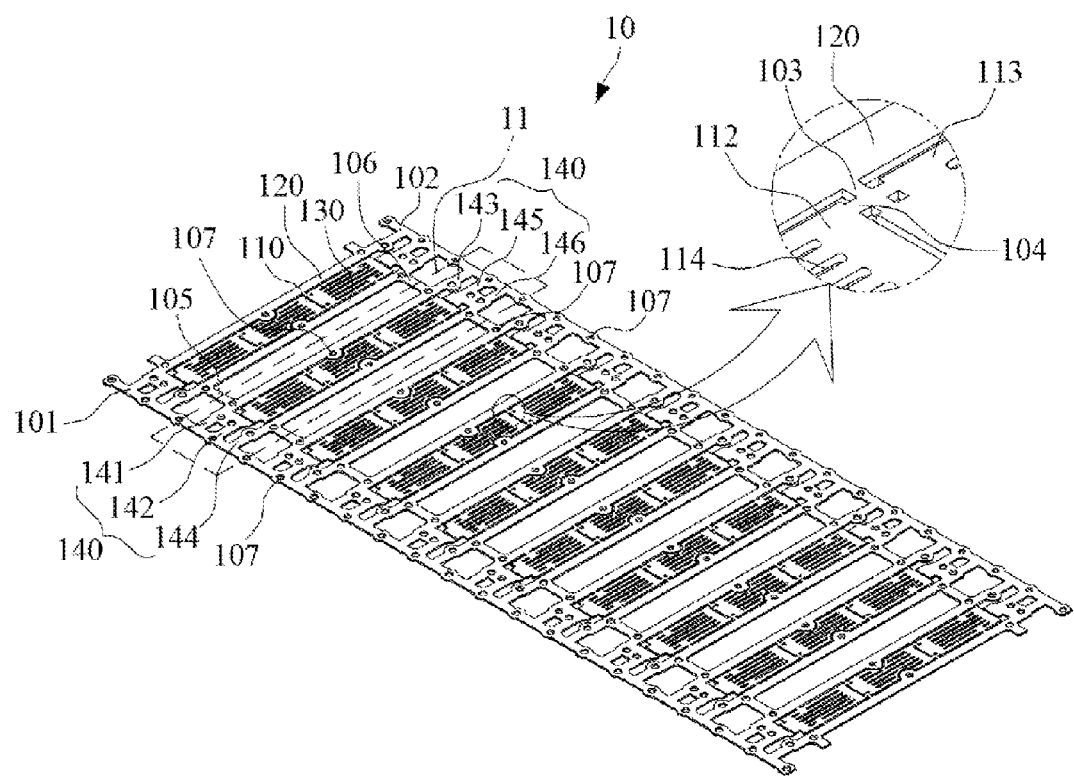
FIG. 2 is an extracted perspective view showing the original electrode plate of FIG. 1.

FIG. 2 is an extracted perspective view showing the original electrode plate of FIG. 1. According to the embodiment of the present invention, one side of the upper line 120 is connected to the first parallel line 101 via first and second power feeding lines 141 and 142, while the other side is connected to the second parallel line 102 via a third power feeding line 143. One side of the lower line 130 is connected to the first parallel line 101 via a fourth power feeding line 144, while the other side is connected to the second parallel line 102 via fifth and sixth power feeding lines 145 and 146.

Depending on the eliminated shape of the power feeding line 140, the electrode pattern 100 may be formed for parallel connection or serial connection or for single module use. Further, depending on the eliminated shape of the parallel lines 101 and 102 or the serial lines 105 and 106, it is possible to form the electrode pattern where a plurality of unit bodies 11 is connected in parallel or the electrode pattern where a plurality of unit bodies 11 is connected in series. The respective electrode patterns will be described later.

According to the embodiment of the present invention, the body portion 110 includes a plurality of body regions 111, 112 and 113 which are longitudinally formed in succession to be spaced apart from each other. The respective body regions 111, 112 and 113 are connected to each other via a horizontal disconnectable portion 104 to facilitate electrical connection and disconnection. As such, if the body portion 110 is divided into the plurality of body regions 111, 112 and 113, the body portion 110 can be easily detached, thus ensuring easy processing and improving heat dissipating performance. Further, the horizontal disconnectable portion 104 may be perpendicular to the vertical disconnectable portion 103.

When the vertical disconnectable portion 103 and the horizontal disconnectable portion 104 are eliminated, the body regions 111, 112 and 113 are separated from each other and are also separated from the upper line 120 and the lower line 130. Here, the LED device 1 is mounted on the electrode pattern 100 in a wire-bonding method through the mounting hole 210 of the frame 200. A pair of wires 2 connecting the LED device 1 with the electrode pattern 100 may connect the upper line 120 with the LED device 1 and connect the body region 111 with the LED device 1. Further, in the above-mentioned method, the LED device 1 may be connected with the body regions 111 and 112, or the LED device 1 may be connected with the body regions 112 and 113, the lower line 120 may be connected with the LED device 1 and the body region 113 may be connected with the LED device 1. Thus, while the LED device 1 is connected with the upper line 120 and the lower line 130, it is electrically connected.

According to the embodiment of the present invention, a plurality of heat dissipating holes 114 may be perforated through the body portion 110. When the heat dissipating holes 114 are formed through the body portion 110 as such, the entire mass of the electrode pattern 100 may be reduced, and in addition, a reduction in raw material may be expected. Further, the surface area of the body portion 110 making contact with the outside air is increased, thus offering superior heat dissipating performance.

According to the embodiment of the present invention, a plurality of fastening holes 107 is perforated in the first and second parallel lines 101 and 102, the upper and lower lines 120 and 130, and the first and second serial lines 105 and 106. Subsequently, a screw or a similar fastening means may be fitted into the fastening hole 107 when the frame 200 is connected with the electrode pattern 100, or the frame 200 and the electrode pattern 100 are secured to a lamp frame or a substrate. Further, the fastening hole may be used for connecting an external wire with the electrode pattern 100.

Figure 3:
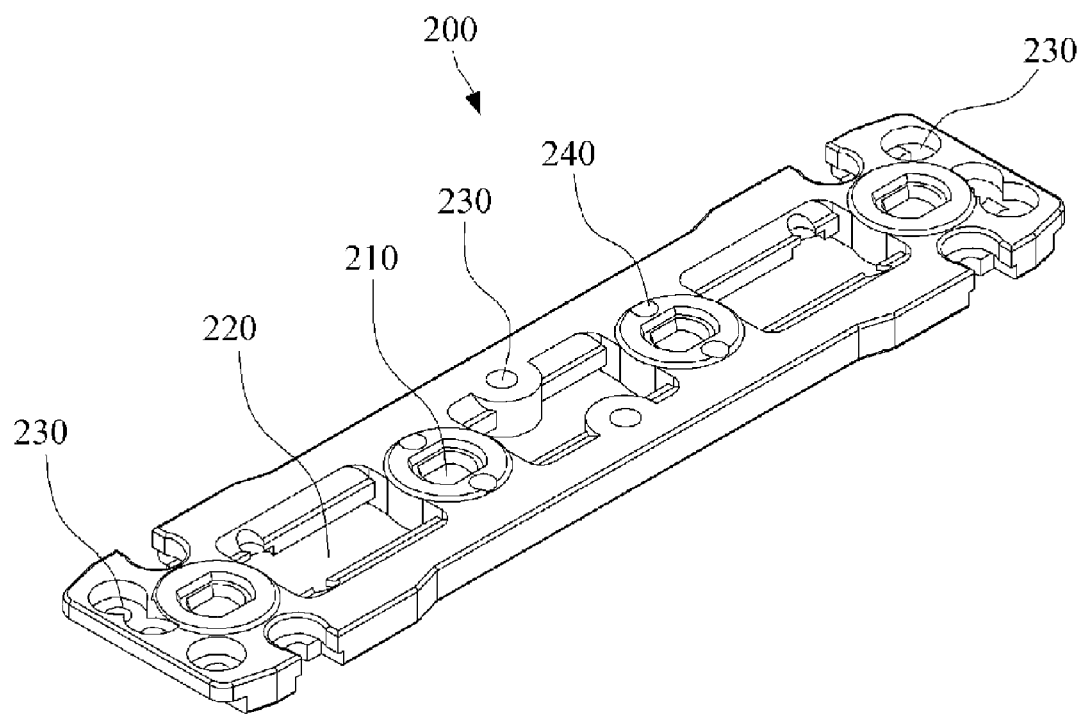
FIG. 3 is an extracted perspective view showing the frame of FIG. 1.

FIG. 3 is an extracted perspective view showing the frame of FIG. 1. According to the embodiment of the present invention, the frame 200 is configured such that the mounting hole 210 for accommodating the LED device 1 is formed per section, and a slit 220 is formed between the mounting holes 210 to expose the body portion 110 to the outside. At least two or more mounting holes 210 may be formed per one frame 200. If three or more mounting holes 210 are formed, the mounting holes 210 may be formed at regular intervals. Meanwhile, the slit 220 is formed between the mounting holes 210 to correspond to the position of the body portion 110 and thereby to expose the body portion 110 of the electrode pattern 100 to the outside. As a result, the body portion 110 is exposed to the outside and thereby comes into contact with the outside air, thus dissipating heat. If the body portion 110 is composed of the plurality of body regions 111, 112 and 113, the slit 220 is preferably formed to correspond to the position of each body region 111, 112, 113.

According to the embodiment of the present invention, the frame 200 is configured such that a connection hole 230 is perforated at a position corresponding to the fastening hole 107 which is formed in the electrode pattern 100. If the connection hole 230 is perforated at the position corresponding to the fastening hole 107, a center of the connection hole 230 is aligned with that of the fastening hole 107 when the frame 200 is coupled with the electrode pattern 100. Thus, by fitting the screw or the like into the aligned connection hole 230 and fastening hole 107, the frame 200 may be connected to the electrode pattern 100, or the frame 200 and the electrode pattern 100 may be secured to the lamp frame, the substrate or the like, and the external wire may be connected to the electrode pattern 100.

Further, the frame 200 may have a disconnecting hole 240 at a position corresponding to the vertical disconnectable portion 103 for connecting the body portion 110 of the electrode pattern 100 with the upper and lower lines 120 and 130 and the horizontal disconnectable portion 104 for connecting the body regions 111, 112 and 113 to each other. This disconnecting hole 240 may serve as a passage for a punching process or the like, when the vertical disconnectable portion 103 or the horizontal disconnectable portion 104 is subsequently eliminated.

According to the embodiment of the present invention, the frame 200 is made of a resin material, and the electrode pattern 100 and the frame 200 are coupled to each other through an insert injection molding method. Thus, during the manufacture of the frame 200, the electrode pattern 100 and the frame 200 may be integrated with each other. In addition, the electrode pattern 100 and the frame 200 may be secured to each other via assembly or adhesion.

The method of manufacturing the electrode module configured as described above is as follows. First, a plate of the conductive material undergoes a predefined process, such as pressing, punching or etching, thus forming the original electrode plate 10. Next, the frame 200 is formed through the insert molding process, and simultaneously the frame 200 is coupled with the original electrode plate 10. Subsequently, a plating operation may be optionally performed for the original electrode plate 10. The original electrode plate 10 formed as such may complete the electrode pattern 100 of various structures by eliminating the power feeding line 140, the parallel lines 101 and 102 or the serial lines 105 and 106 and the vertical disconnectable portion 103 and the horizontal disconnectable portion 104 through punching or the like. Thereafter, the LED device 1 is wire-bonded to the electrode pattern 100 through the mounting hole 210 of the frame 200.

Hereinafter, various embodiments of the electrode pattern 100 that is formed by cutting the original electrode plate 10 will be described with reference to the accompanying drawings.

Figure 4:
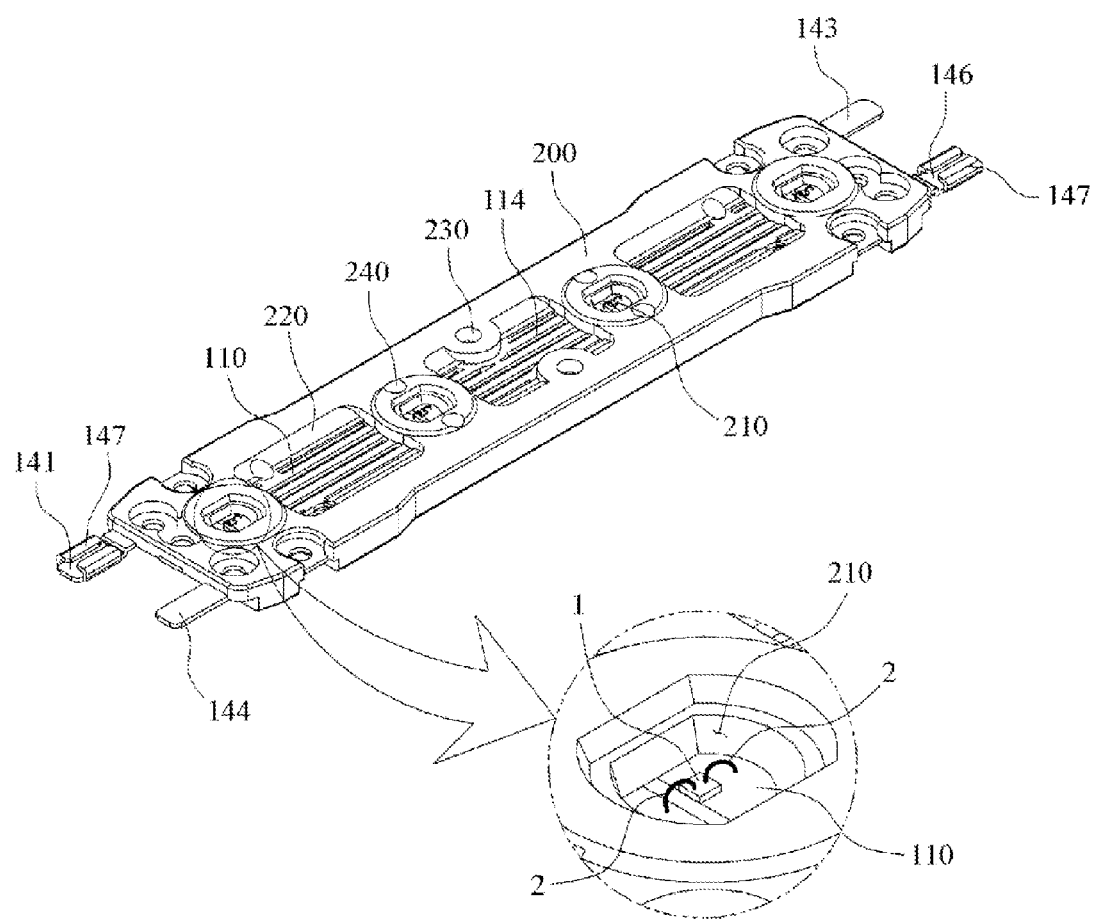
FIG. 4 is a perspective view showing an electrode module for parallel connection according to an embodiment of the present invention.
Figure 5:
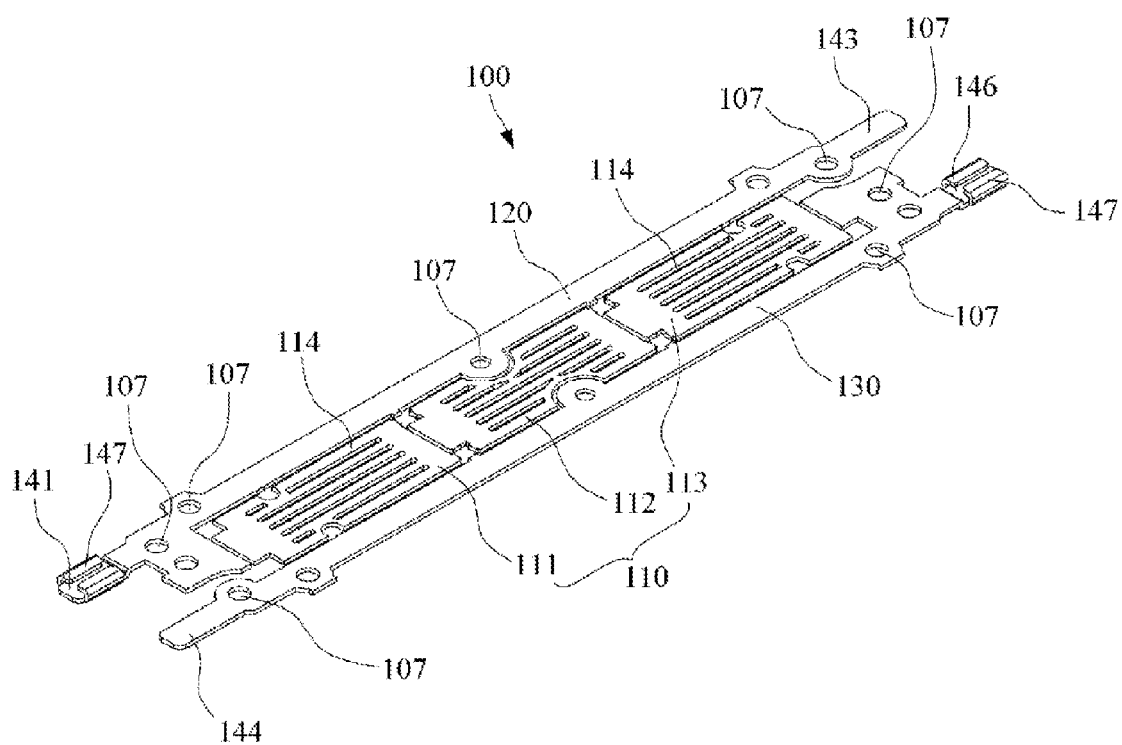
FIG. 5 is an extracted perspective view showing an electrode pattern of FIG. 4.

FIG. 4 is a perspective view showing an electrode module for parallel connection according to an embodiment of the present invention, and FIG. 5 is an extracted perspective view showing an electrode pattern of FIG. 4. As shown in the drawings, the electrode pattern 100 is for the purpose of parallel connection, which is longitudinally connected to the body portion 110. The original electrode plate 10 is cut per unit body 11, and is formed by eliminating the first and second parallel lines 101 and 102, second and fifth power feeding lines 142 and 145 and the first and second serial lines 105 and 106, and eliminating the vertical disconnectable portion 103 and the horizontal disconnectable portion 104.

Here, first and fourth power feeding lines 141 and 144 remain on one side of the electrode pattern 100, while third and sixth power feeding lines 143 and 146 remain on the other side thereof. That is, the first and fourth power feeding lines 141 and 144 are formed on both ends of the upper line 120, and the third and sixth power feeding lines 143 and 146 are formed on both ends of the lower line 130. When the upper line 120 is formed as a positive pole, the lower line 130 is formed as a negative pole. In contrast, when the upper line 120 is formed as the negative pole, the lower line 130 is formed as the positive pole. The first power feeding line 141 is connected with the third power feeding line 143, and the fourth power feeding line 144 is connected with the sixth power feeding line 146, so that the electrode patterns 100 may be in parallel connected to each other. Meanwhile, the LED device 1 mounted on the electrode pattern 100 is electrically connected while being connected to the upper line 120 and the body region 111, the body region 111 and the body region 112, the body region 112 and the body region 113, or the body region 113 and the lower line 120 through wire bonding, and the LED device 1 is illuminated.

Figure 6:
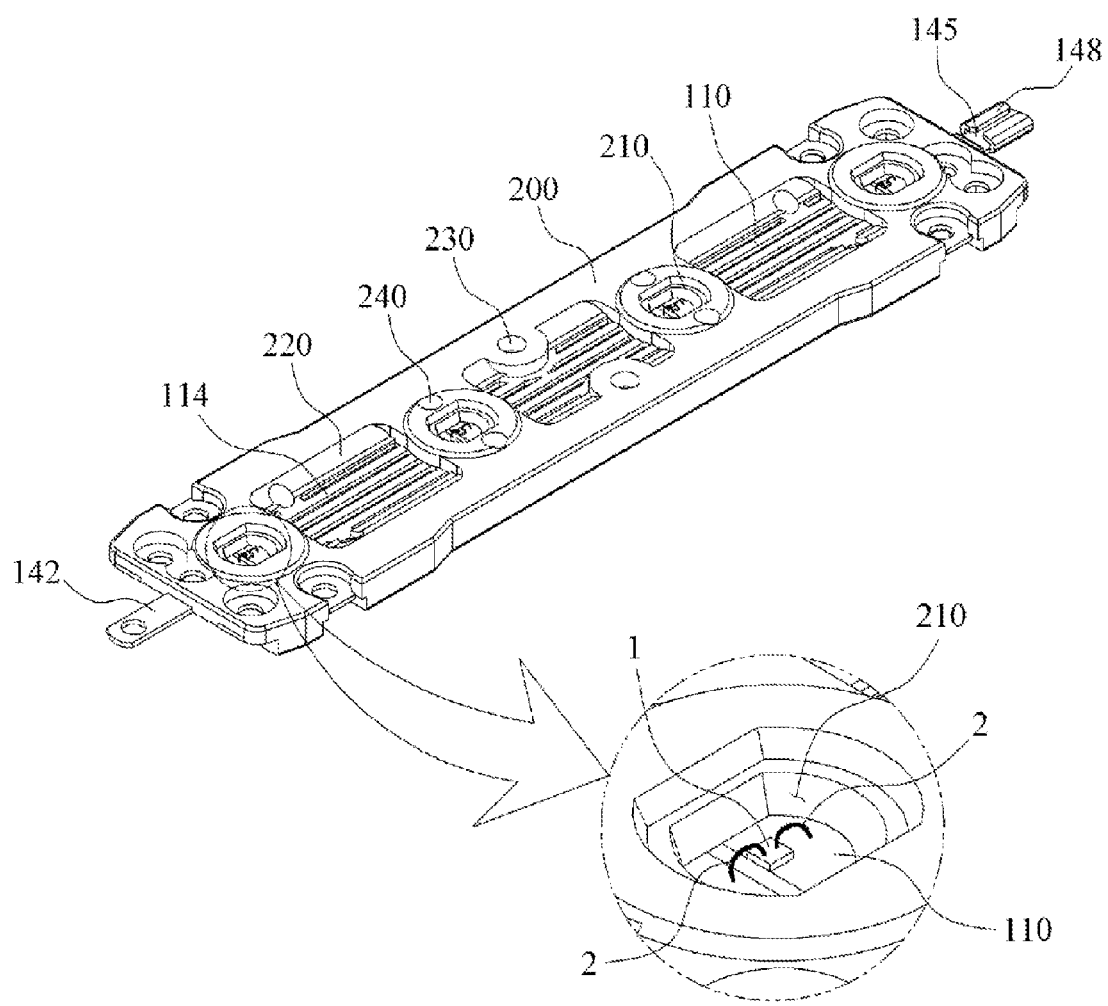
FIG. 6 is a perspective view showing an electrode module for serial connection according to an embodiment of the present invention.
Figure 7:
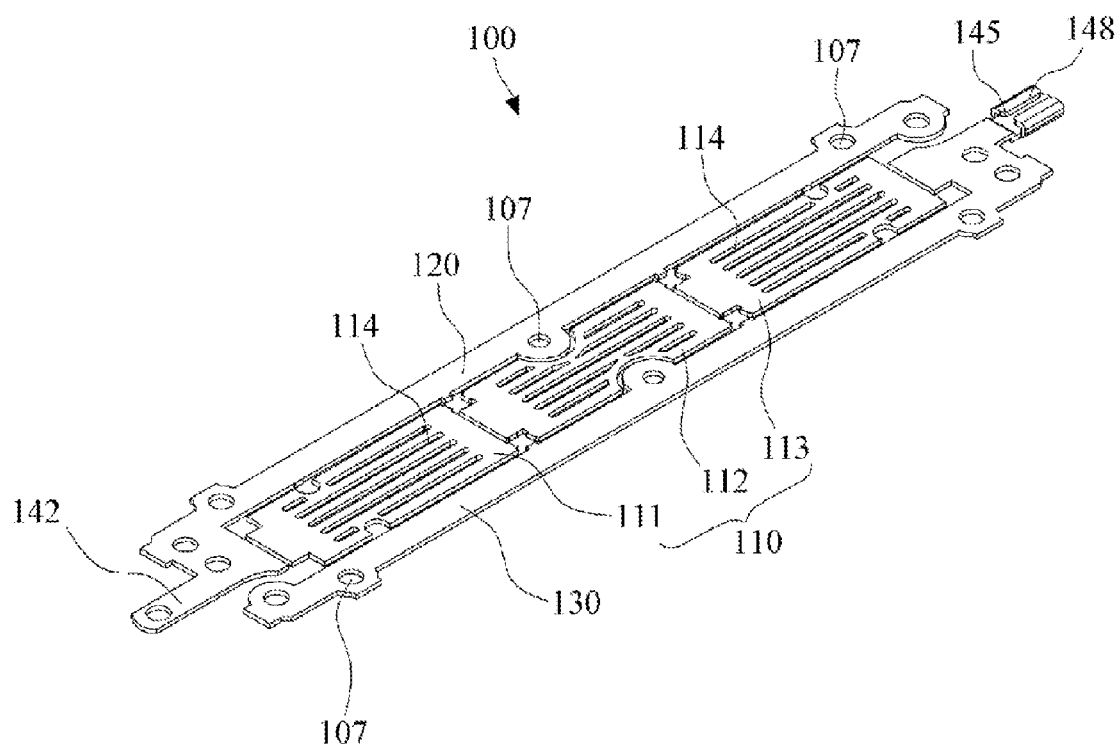
FIG. 7 is an extracted perspective view showing an electrode pattern of FIG. 6.

FIG. 6 is a perspective view showing an electrode module for serial connection according to an embodiment of the present invention, and FIG. 7 is an extracted perspective view showing an electrode pattern of FIG. 6. As shown in the drawings, the electrode pattern 100 is for the purpose of serial connection, which is longitudinally connected to the body portion 110. The original electrode plate 10 is cut per unit body 11, and is formed by eliminating the first and second parallel lines 101 and 102, the first, third, fourth and sixth power feeding lines 141, 143, 144 and 146 and the first and second serial lines 105 and 106, and eliminating the vertical disconnectable portion 103 and the horizontal disconnectable portion 104.

Here, the second power feeding line 142 remains on one side of the electrode pattern 100, while the fifth power feeding line 145 remains on the other side thereof. That is, the second power feeding line 142 is formed on one end of the upper line 120, and the fifth power feeding line 145 is formed on the other end of the lower line 130. When the upper line 120 is formed as the positive pole, the lower line 130 is formed as the negative pole. In contrast, when the upper line 120 is formed as the negative pole, the lower line 130 is formed as the positive pole. The second power feeding line 142 is connected with the fifth power feeding line 145, so that the electrode patterns 100 may be in series connected to each other. Meanwhile, the LED device 1 mounted on the electrode pattern 100 is electrically connected while being connected to the upper line 120 and the body region 111, the body region 111 and the body region 112, the body region 112 and the body region 113, or the body region 113 and the lower line 120 through wire bonding, and the LED device 1 is illuminated.

According to the embodiment of the present invention, portions of the first and second parallel lines 101 and 102 connected with the first power feeding line 141 and the sixth power feeding line 146 or the third power feeding line 143 and the fourth power feeding line 144 are bent upwards with respect to the power feeding lines 141, 143, 144 and 146, thus forming a socket 147. Portions of the first and second parallel lines 101 and 102 connected with the second power feeding line 142 or the fifth power feeding line 145 are bent upwards with respect to the power feeding lines 142 and 145, thus forming a socket 148.

The sockets 147 and 148 may be shaped as follow: the first and second parallel lines 101 and 102 connected to an end of the power feeding line 140 are cut to form a 'T' shape with the power feeding line 140, are primarily bent upwards to be perpendicular to the power feeding line 140, and are secondarily bent inwards to be next to the power feeding line 140. Thereby, the power feeding lines having no socket 147, 148 are fitted into the sockets 147 and 148, thus allowing the electrode patterns 100 to be easily fastened to each other.

In the electrode pattern 100 for the parallel connection as shown in FIG. 5, preferably, the socket 147 is formed only on each of the first and fourth power feeding lines 141 and 144 which are formed on one side of the electrode pattern 100 or on each of the third and sixth power feeding lines 143 and 146 which are formed on the other side thereof, or the socket 147 is formed only on each of the power feeding lines which are offset from each other. By way of example, the socket 147 is formed only on each of the first power feeding line 141 and the sixth power feeding line 146, so that the third power feeding line 143 having no socket 147 is fitted into the socket 147 formed on the first power feeding line 141 of another electrode pattern 100, and the fourth power feeding line 144 having no socket 147 is fitted into the socket 147 formed on the sixth power feeding line 146 of a further electrode pattern 100, and thereby it is possible to connect the plurality of electrode patterns 100 to each other.

Meanwhile, in the electrode pattern 100 for the serial connection as shown in FIG. 7, the socket 148 is formed only on the second power feeding line 142 formed on one side of the electrode pattern 100 or on the fifth power feeding line 145 formed on the other side thereof, so that the second power feeding line 142 having no socket 148 may be fitted into the socket 148 formed on the fifth power feeding line 145 of another electrode pattern 100 and thereby it is possible to connect the plurality of electrode patterns 100 to each other.

Figure 8:
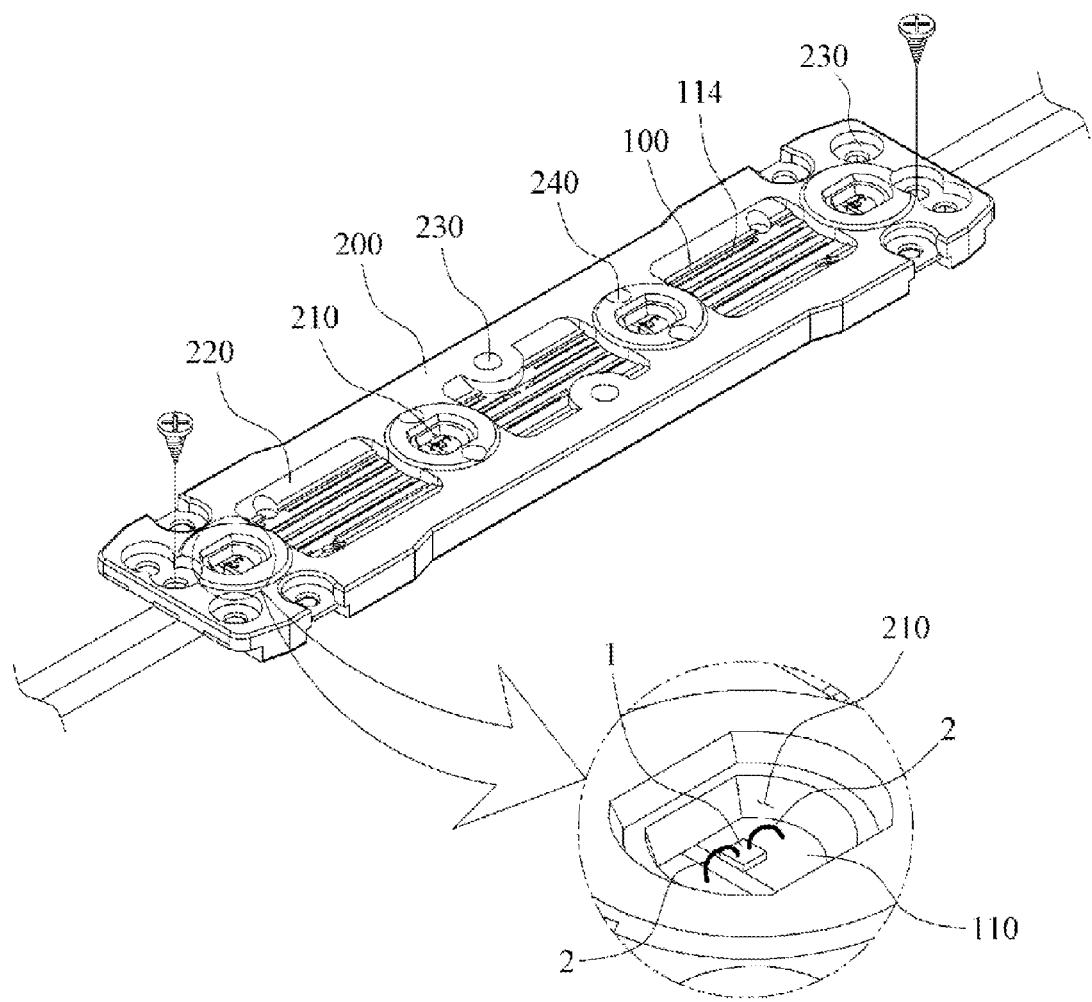
FIG. 8 is a perspective view showing an electrode module for single module use according to an embodiment of the present invention.
Figure 9:
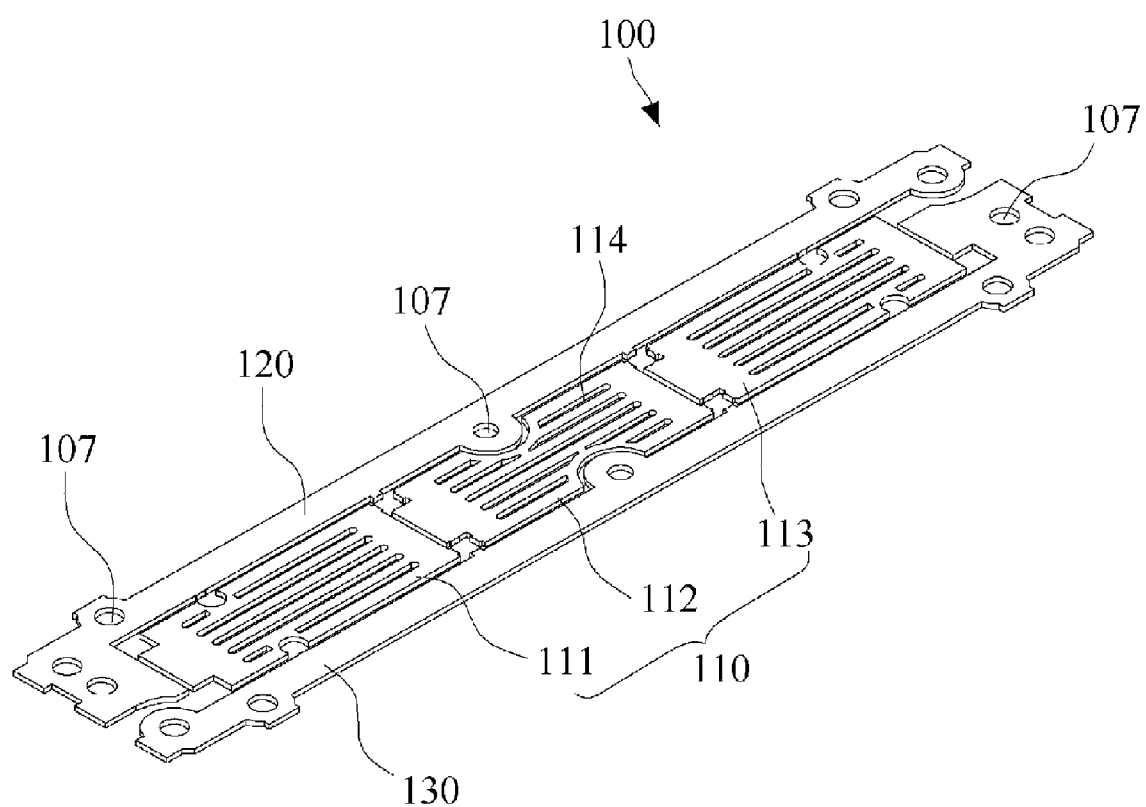
FIG. 9 is an extracted perspective view showing an electrode pattern of FIG. 8.

FIG. 8 is a perspective view showing an electrode module for single module use according to an embodiment of the present invention, and FIG. 9 is an extracted perspective view showing an electrode pattern of FIG. 8. As shown in the drawings, the electrode pattern 100 is for the purpose of single module use. The original electrode plate 10 is cut per unit body 11, and is formed by eliminating the first and second parallel lines 101 and 102, the first and second serial lines 105 and 106, all the power feeding lines 140, the vertical disconnectable portion 103 and the horizontal disconnectable portion 104. That is, all the power feeding lines 140 are eliminated and the upper line 120, the lower line 130 and the body portion 110 merely remain. Here, when the upper line 120 is formed as the positive pole, the lower line 130 is formed as the negative pole. In contrast, when the upper line 120 is formed as the negative pole, the lower line 130 is formed as the positive pole. By connecting wires to both ends of the upper and lower lines 120 and 130, they may be supplied with current. The screw is fitted into the connection hole 230 and the fastening hole 107 with the wires disposed, so that the external wire may be electrically conductively connected to the electrode pattern 100. Meanwhile, the LED device 1 mounted on the electrode pattern 100 is electrically connected while being connected to the upper line 120 and the body region 111, the body region 111 and the body region 112, the body region 112 and the body region 113, or the body region 113 and the lower line 120 through wire bonding, and the LED device 1 is illuminated.

Figure 10:
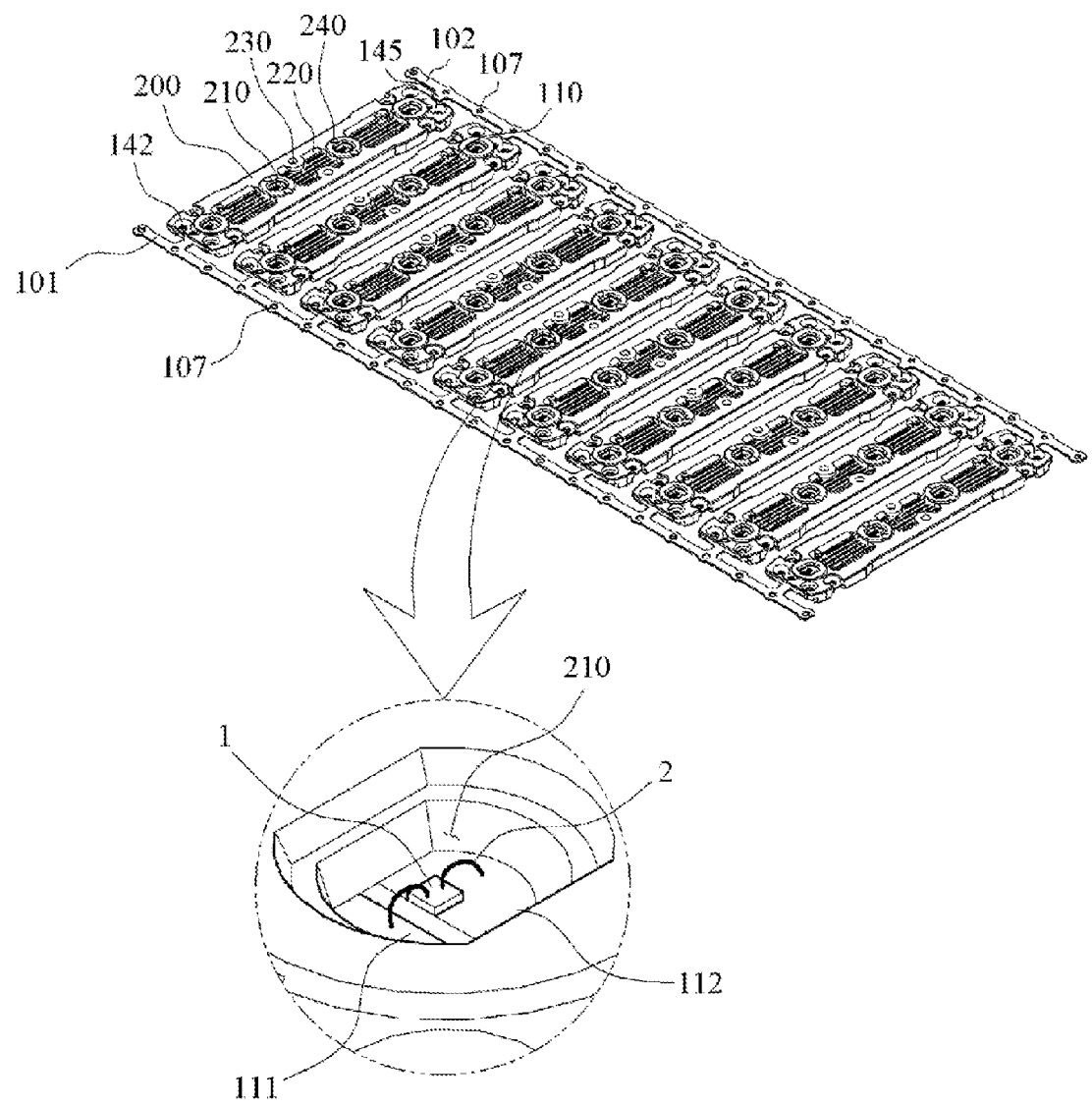
FIG. 10 is a perspective view showing a parallel connected electrode module according to an embodiment of the present invention.
Figure 11:
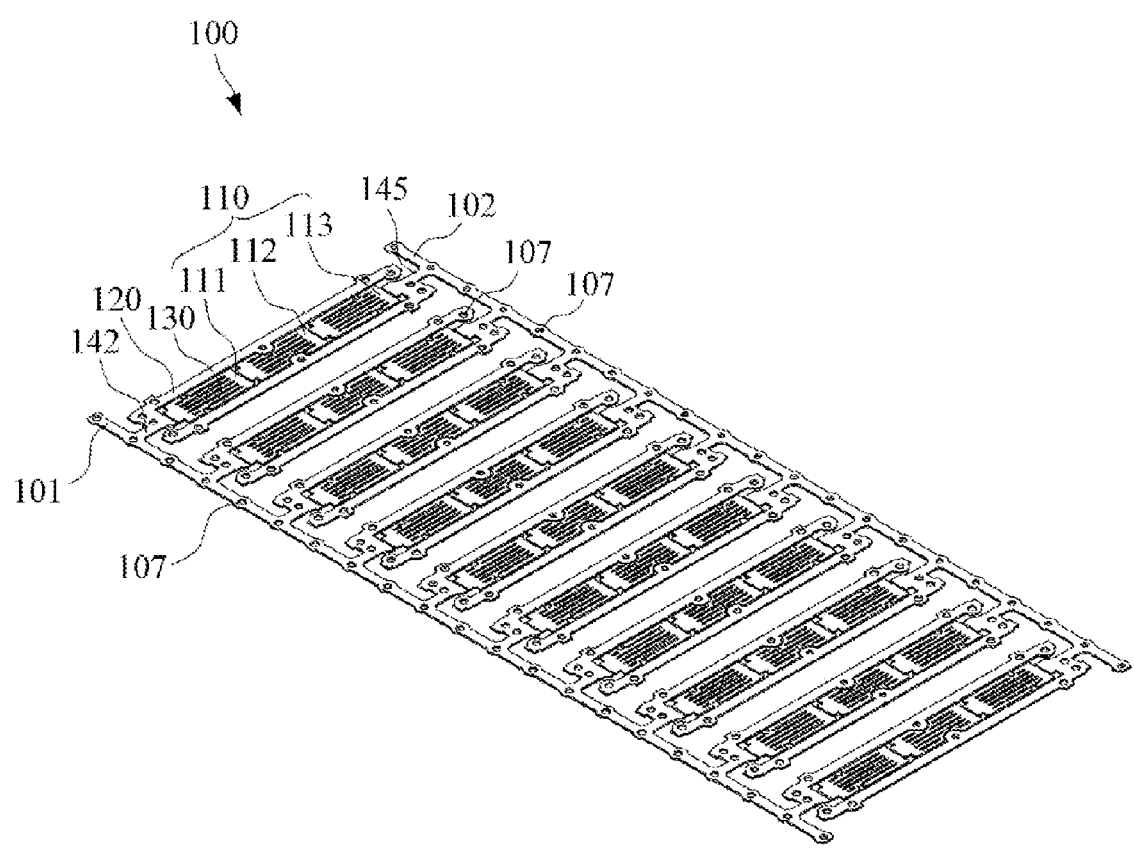
FIG. 11 is an extracted perspective view showing an electrode pattern of FIG. 10.

FIG. 10 is a perspective view showing a parallel connected electrode module according to an embodiment of the present invention, and FIG. 11 is an extracted perspective view showing an electrode pattern of FIG. 10. As shown in the drawings, the electrode pattern 100 is the parallel electrode pattern composed of the plurality of unit bodies 11 which are connected to each other side by side via the first and second parallel lines 101 and 102. The electrode pattern is formed by eliminating the first, third, fourth and sixth power feeding lines 141, 143, 144 and 146, the first and second serial lines 105 and 106, the vertical disconnectable portion 103 and the horizontal disconnectable portion 104. Thus, all the upper lines 120 are connected to only the first parallel line 101, and all the lower lines 130 are connected to only the second parallel line 102.

Here, the LED device 1 mounted on the electrode pattern 100 is connected to the upper line 120 and the body region 111, the body region 111 and the body region 112, the body region 112 and the body region 113, or the body region 113 and the lower line 120 through wire bonding, and currents of different poles flow in the first and second parallel lines 101 and 102, respectively. Consequently, the LED device 1 mounted on the electrode pattern 100 can be illuminated.

Figure 12:
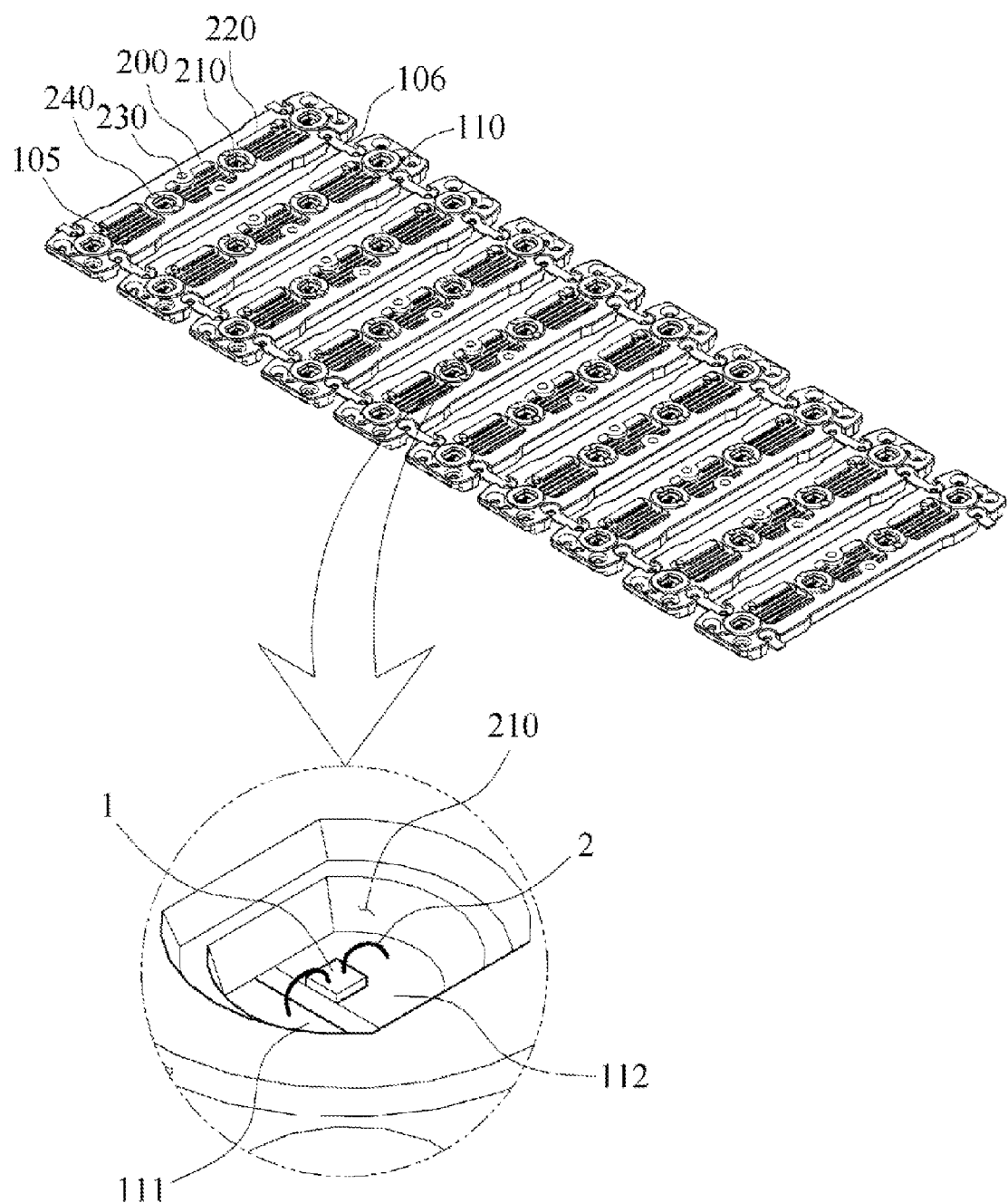
FIG. 12 is a perspective view showing a serial connected electrode module according to an embodiment of the present invention.
Figure 13:
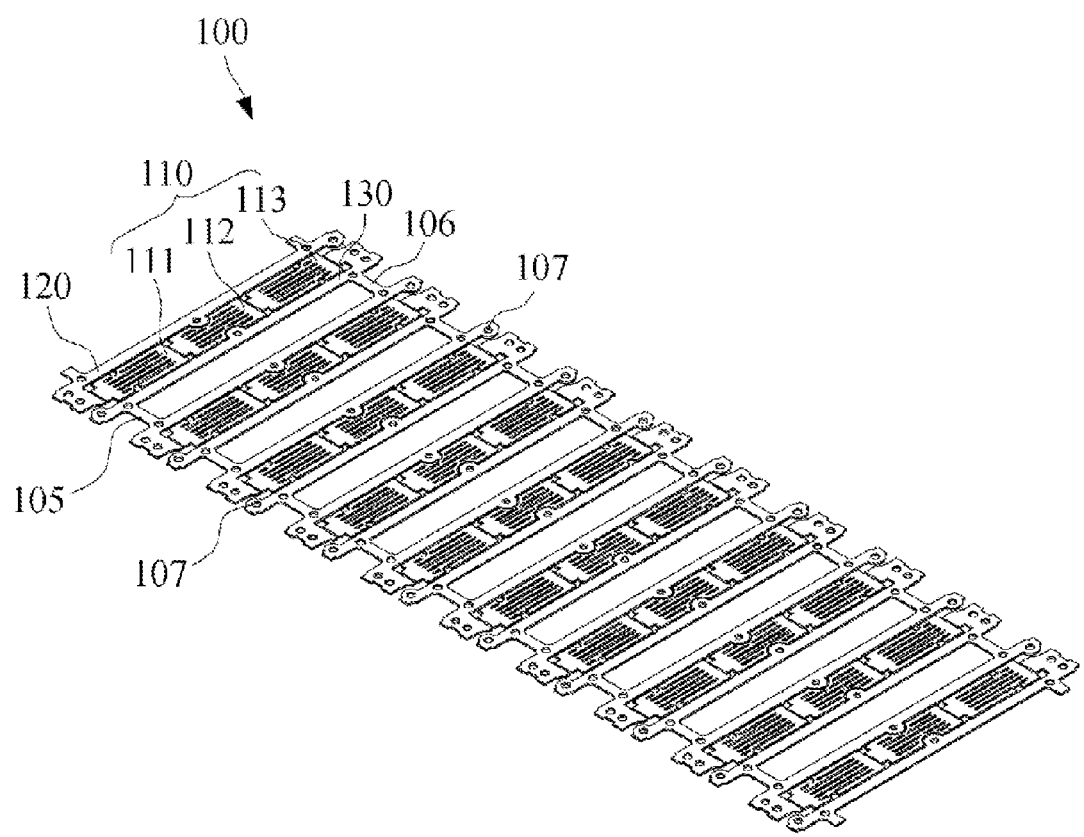
FIG. 13 is an extracted perspective view showing an electrode pattern of FIG. 12.

FIG. 12 is a perspective view showing a serial connected electrode module according to an embodiment of the present invention, and FIG. 13 is an extracted perspective view showing an electrode pattern of FIG. 12. As shown in the drawings, the electrode pattern 100 is the serial electrode pattern composed of the plurality of unit bodies 11 which are connected to each other side 7by side via the first and second serial lines 105 and 106. The electrode pattern is formed by eliminating the first and second parallel lines 101 and 102, all the power feeding lines 140, the vertical disconnectable portion 103 and the horizontal disconnectable portion 104. Here, the LED device 1 mounted on the electrode pattern 100 is connected to the upper line 120 and the body region 111, the body region 111 and the body region 112, the body region 112 and the body region 113, or the body region 113 and the lower line 120 through wire bonding. Among the electrode patterns 100 having the plurality of unit bodies 11, currents of different poles flow in the upper line 120 of the uppermost electrode pattern 100 and the lower line 130 of the lowermost electrode pattern 100. Consequently, the LED device 1 mounted on the electrode pattern 100 can be illuminated.

As described above, the present invention provides the electrode module for the LED module, which maximizes the surface area of the electrode portion on which the LED device is mounted, thus minimizing thermal resistance and maximizing the flow of electrons in the lead wire, and which maximally copes with surface resistance on the surface of the electrode in the LED, thus minimizing a voltage drop. Further, since the electrode module may be rolled up or curved, processability is good and it is possible to provide the electrode pattern of various outputs. In the serial or parallel circuit configuration, the additional wiring or PCB is not required, and simultaneously it is possible to form the circuit of the module without a soldering process.

Although the embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An electrode module for an LED lamp comprising:
a frame, made of a nonconductive material, having a plurality of mounting holes to accommodate an LED device, a slit being formed between the mounting holes; and
an electrode pattern, made of a conductive material, integrally being coupled with the frame to supply power to the LED device,
wherein the electrode pattern formed with a plurality of unit bodies connected in series formed repeatedly side by side, the electrode pattern comprising:
a first electrode pattern and a second electrode pattern arranged side by side on both sides of the electrode module in parallel, the first electrode pattern including a first serial line and the second electrode pattern including a second serial line;
a body interposed between the first and second electrode patterns, the body being exposed to an outside using the slit; and
an first line and a second line arranged side by side at the body, the body comprising a plurality of body regions, each of the body regions being formed adjacent each other, the first and second lines being connected with the plurality of body regions through a vertical disconnectable portion, and connected the first and second electrode patterns, respectively, via power feeding lines,
wherein first and second lines of the body are connected to the plurality of body regions and are connected with each other through the first and second electrode patterns.

2. The electrode module according to claim 1, wherein a first side of the first line is connected with the first electrode pattern via a first and a second power feeding lines, while a second side of the first line is connected with the second electrode pattern via a third power feeding line, and a first side of the second line is connected with the first electrode pattern via a fourth power feeding line, while a second side of the second line is connected with the second electrode pattern via a fifth and a sixth power feeding lines.

3. The electrode module according to claim 2, wherein the the plurality of body regions are longitudinally arranged in succession and to be spaced apart from each other, each of the body regions is connected to each other via a horizontal disconnectable portion to allow for electrical connection and disconnection.

4. The electrode module according to claim 1, wherein the body comprises a plurality of heat dissipating holes so as to perform a heat dissipating function.

5. The electrode module according to claim 1, wherein a plurality of fastening holes is perforated in the first and second electrode patterns and the first and second lines.

6. The electrode module according to claim 1, wherein the electrode pattern is formed in parallel connection, which is connected feeding lines comprising a first through fifth power feeding lines of the body.

7. The electrode module according to claim 6, wherein the electrode pattern is formed in serial connection, which is connected in a longitudinal direction of the body.

8. The electrode module according to claim 6, wherein portions of the first and second electrode patterns connected to the first power feeding line and the sixth power feeding line or the third power feeding line and the fourth power feeding line that are bent upwards relative to the power feeding lines, to form a socket.

9. The electrode module according to claim 7, wherein portions of the first and second electrode patterns connected to the second power feeding line or the fifth power feeding line are bent upwards relative to the power feeding lines to form a socket.

10. The electrode module according to claim 6, wherein the electrode pattern is a single module.

11. The electrode module according to claim 6, wherein the electrode pattern is a parallel electrode pattern composed of a plurality of unit bodies which are connected side by side via the first and second electrode patterns.

12. The electrode module according to claim 6, wherein the electrode pattern is a serial electrode pattern composed of a plurality of unit bodies which are connected side by side via the first and second serial lines.

13. The electrode module according to claim 5, wherein the frame comprises a connection hole that is perforated at a position corresponding to each of the fastening holes that are formed in the electrode pattern.

14. The electrode module according to claim 1, wherein the frame is made of a resin material, the electrode pattern and the frame being coupled to each other.

* * * * *